US008109321B2

(12) United States Patent
Alousi et al.

(10) Patent No.: US 8,109,321 B2
(45) Date of Patent: Feb. 7, 2012

(54) MODULAR HEAT SINK ASSEMBLY COMPRISING A LARGER MAIN HEAT SINK MEMBER THERMALLY CONNECTED TO SMALLER ADDITIONAL FLOATING HEAT SINK MEMBERS

(75) Inventors: Sinan Alousi, Sunnyvale, CA (US); Daniel Anav, San Jose, CA (US); Joseph D. Griffin, Lake Oswego, OR (US); Ali Mira, Morgan Hill, CA (US); Michael Mira, Morgan Hill, CA (US); Henry Schrader, Mountain View, CA (US)

(73) Assignee: Alcatel Lucent, Paris (FR)

( * ) Notice: Subject to any disclaimer, the term of this patent is extended or adjusted under 35 U.S.C. 154(b) by 980 days.

(21) Appl. No.: 12/043,078

(22) Filed: Mar. 5, 2008

(65) Prior Publication Data

US 2009/0223647 A1 Sep. 10, 2009

(51) Int. Cl.
*F28F 7/02* (2006.01)

(52) U.S. Cl. .................................. 165/80.3; 165/104.21

(58) Field of Classification Search ................. 165/80.2, 165/80.3, 104.21, 104.33; 361/700
See application file for complete search history.

(56) References Cited

U.S. PATENT DOCUMENTS

| 4,628,990 | A | * | 12/1986 | Hagihara et al. | ............. | 165/80.4 |
| 5,740,013 | A | * | 4/1998 | Roesner et al. | ............... | 361/697 |
| 2006/0291172 | A1 | * | 12/2006 | Lee et al. | ....................... | 361/719 |

* cited by examiner

*Primary Examiner* — Teresa Walberg
(74) *Attorney, Agent, or Firm* — Duft Bornsen & Fishman LLP (57) ABSTRACT

A modular heat sink assembly is disclosed. The heat sink assembly includes a main (larger) heat sink member having one or more voids through the member. The heat sink assembly also includes one or more additional (smaller) heat sink members that fit within the voids of the main heat sink member and are able to move (float) within the voids while thermally connected to main heat sink member. The thermal connection to the main heat sink member may be accomplished by incorporating heat pipes as a bridge between the heat sink members, so that heat spreading, and regulation thereof, occurs over the additional heat sink members and the main heat sink member.

20 Claims, 7 Drawing Sheets

MODULAR HEAT SINK ASSEMBLY COMPRISING A LARGER MAIN HEAT SINK MEMBER THERMALLY CONNECTED TO SMALLER ADDITIONAL FLOATING HEAT SINK MEMBERS

BACKGROUND OF THE INVENTION

1. Field of the Invention

The invention is related to the field of heat sinks, and in particular, to a modular heat sink assembly that has a larger main heat sink member with one or more smaller additional heat sink members that are assembled within voids in the main heat sink member in a movable fashion. The additional heat sink members are thermally connected to the main heat sink member, such as through heat pipes, but are able to move within the voids in the main heat sink member to accommodate different component heights on circuit boards.

2. Statement of the Problem

Computers, routers, and other electronic devices are built with processors, memory, and other electronic components that are fabricated on circuit boards. Each of the active components on the circuit board draws a current in order to operate. When a component draws a current, thermal energy (or heat) is created in the component. If the thermal energy in the component increases above a maximum threshold level, then the component may be damaged. One way to protect the component is to use a heat sink to remove heat from electronic components.

A heat sink is a device that absorbs and dissipates heat from a component which is in thermal contact with the heat sink. A heat sink functions to efficiently transfer thermal energy from the component to the heat sink, which has a much greater surface area and heat removal capacity. A typical heat sink is formed from a metal, such as copper or aluminum, which has a high thermal conductivity. One surface of the heat sink includes a plurality of fins which creates a large surface area for dissipating heat. When the thermal energy is transferred from the component to the heat sink, the thermal energy is rapidly dissipated to the surrounding environment due to the large surface area of the fins, which cools the component.

Circuit boards may include multiple components that have a high enough thermal energy, and consequently a higher temperature, that heat sinks are needed or desired. For example, microprocessors, power-handling semiconductors, Application-Specific Integrated Circuits (ASIC), etc, typically draw higher currents than other components, and consequently operate at a higher temperature. To provide the desired heat dissipation for the components on the circuit board, an individual heat sink is typically mounted on each of the components on the circuit board. The size of an individual heat sink may depend on the heat dissipation needs for a given component.

As the size of circuit boards decreases to accommodate smaller electronic devices, there is much less room for individual heat sinks. If two or more components are mounted on a circuit board next to each other, there may not be room to mount an individual heat sink on each of the components. This may result in damage to one or more of the components if the heat generated during operation exceeds a maximum rated temperature for the component.

One solution to the problem of individual heat sinks is to use one or more larger heat sinks. A large heat sink is simultaneously mounted on multiple components in order to dissipate the heat from the components. Unfortunately, there can also be problems associated with a large heat sink. For one, a large heat sink may conduct excessive thermal energy from one component to another, creating the potential for thermal damage. Also, the components on the circuit board may have varying heights in relation to the top of the circuit board, which makes using a large heat sink difficult to use. The large heat sink can also apply excessive or uneven force to the components with the greater heights, which can damage the components.

This can especially be a problem when the covers or lids on a component are removed or are omitted during fabrication. Lids are formed on components to protect the fragile components from damage. The lid of a component, commonly formed from aluminum or plastic, may have thermal impedance that negatively affects the dissipation of the heat from the active component underneath the lid. Thus, the lids are sometimes removed, or are omitted during fabrication, so that the heat sink can directly contact the active element instead of contacting the lid. However, when the lid is removed, the component is very susceptible to damage. If a large heat sink is used on a circuit board having one or more lid-less components, then the force applied by the large heat sink can damage the components.

SUMMARY OF THE SOLUTION

Embodiments of the invention solve the above and other related problems with an improved modular heat sink assembly. The heat sink assembly includes a main (larger) heat sink member having one or more voids through the member. The heat sink assembly also includes one or more additional (smaller) heat sink members that fit within the voids and are able to move within the voids. For example, an additional heat sink member may be of a size and dimension that it is able to pass through a void in the main heat sink member. Also, an additional heat sink member may be movably coupled to the main heat sink member through a spring attachment or some other connecting member that applies a downward force on the additional heat sink member, yet the additional heat sink member is movable within the void. The additional heat sink member(s) is thermally connected to the main heat sink member so that heat spreading occurs over the additional heat sink member(s) and the main heat sink member. For example, one or more heat pipes may connect the main heat sink member and the additional heat sink member(s) so that thermal energy may be transferred from the additional heat sink member(s) to the main heat sink member.

The heat sink assembly described above provides many advantages. If the heat sink assembly is connected to or mounted on a circuit board having multiple components, then the main heat sink member can thermally connect with one or more components on the circuit board. The components thermally connected to the main heat sink member may have similar heights, similar thermal energies, etc. At the same time, one of the additional heat sink members may be thermally connected to another component on the circuit board. This component may have a different height than the components connected to the main heat sink member. Because the additional heat sink member is movable within the void, the additional heat sink member is able to adjust for the different height of the component. Thus, the component is less susceptible to damage from the heat sink assembly, which is especially an advantage if the component is lid-less.

The component in thermal contact with the additional heat sink member may have a different thermal energy than the components connected to the main heat sink member. If a spring force is applied to the additional heat sink member, then a thin layer of thermally conductive grease may be used between the additional heat sink member and the component, which has low thermal impedance. Thermal energy may then be efficiently transferred from the component to the additional heat sink member, and be done in such a way as to control the amount of heat transfer to the adjacent components, thereby preventing thermal damage. Also, there is heat spreading from the additional heat sink member to the main heat sink member, such as through heat pipes, to allow for effective dissipation of heat from the component having the high thermal energy.

The heat sink assembly as described herein can be effectively used on a circuit board in place of individual heat sinks for each of the components. Thus, if components are connected to a circuit board in a small area, then the heat sink assembly may be used in place of the individual heat sinks that may not fit in the small area. And because the heat sink assembly includes the additional heat sink members, the heat sink assembly can be used on circuit boards that have different types of components that have different heights, different thermal energies, etc.

The invention may include other exemplary embodiments described below.

DESCRIPTION OF THE DRAWINGS

The same reference number represents the same element or same type of element on all drawings.

DETAILED DESCRIPTION OF THE INVENTION

FIGS. 1-8 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
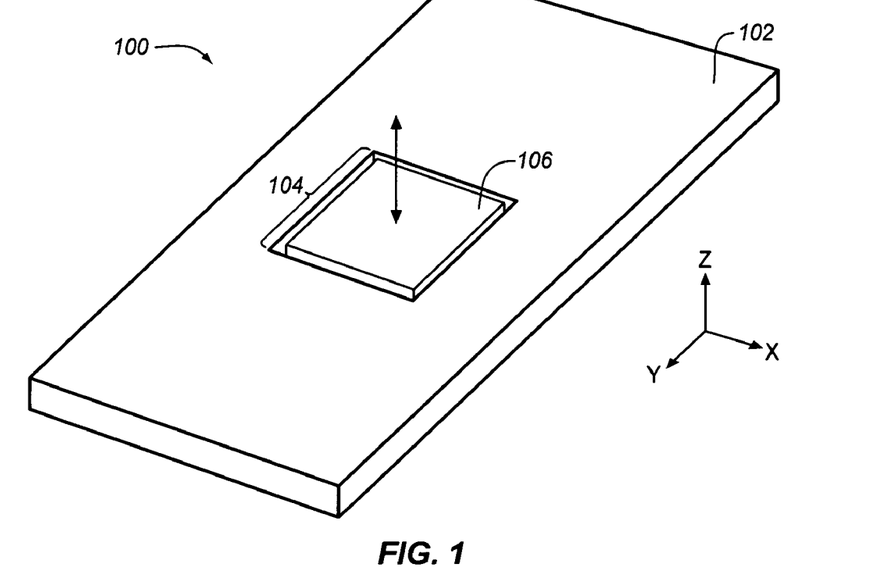
FIG. 1 is an isometric view of a heat sink assembly in an exemplary embodiment of the invention.

FIG. 1 is an isometric view of a heat sink assembly 100 in an exemplary embodiment of the invention. Heat sink assembly 100 includes a main heat sink member 102 and one or more additional heat sink members 106. Main heat sink member 102 comprises any structure that is adapted to absorb and dissipate heat from another object, such as a component on a circuit board. Main heat sink member 102 has one or more voids 104, which are openings or cut-outs in main heat sink member 102. Void 104 is shown as being located within the outer boundary of main heat sink member 102, but one or more voids 104 may additionally or alternatively be located on the outer boundary of main heat sink member 102.

Additional heat sink member 106 of heat sink assembly 100 is adapted to fit within void 104. Additional heat sink member 106 comprises any structure that is adapted to absorb and dissipate heat from another object, such as a component on a circuit board. Although only one additional heat sink member 106 is illustrated in FIG. 1, heat sink assembly 100 may include multiple additional heat sink members 106 that are positioned in multiple voids 104 in main heat sink member 102.

FIG. 1 illustrates a top view of heat sink assembly 100 (i.e., the side opposite a circuit board is visible). The top surface of main heat sink member 102 and/or additional heat sink member 106 may include a plurality of fins as is common in heat sinks. The fins create additional surface area to assist in dissipating heat to the surrounding environment. Embodiments illustrating fins on the top surfaces are shown below and in FIGS. 4-5 and 7-8.

Additional heat sink member 106 is of the proper size and dimensions relative to void 104 to be able to move within void 104. In FIG. 1, additional heat sink member 106 is adapted to move within void 104 along the Z-axis. Additional heat sink member 106 may be movably coupled to main heat sink member 102 by one or more connecting members. The connecting member(s) support additional heat sink member 106 within void 104, but allow additional heat sink member 106 to move along the Z-axis.

Figure 2:
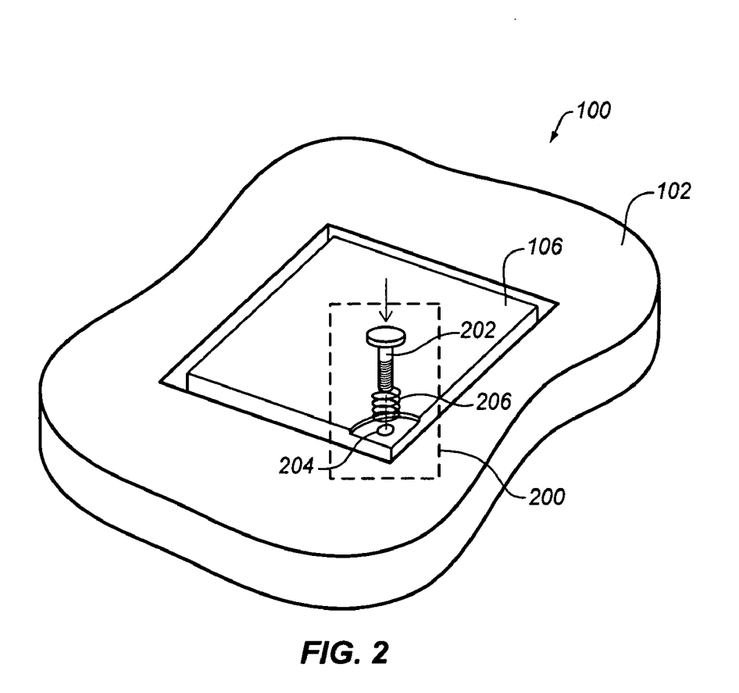
FIG. 2 is another isometric view of an additional heat sink member with a connecting member in an exemplary embodiment of the invention.

FIG. 2 is an isometric view of additional heat sink member 106 with a connecting member 200 in an exemplary embodiment of the invention. Connecting member 200 in this embodiment comprises a screw 202 adapted to pass through a hole 204 in additional heat sink member 106 and connect with main heat sink member 102. Main heat sink member 102, although not visible in FIG. 2, has a corresponding threaded hole adapted to receive screw 202. Connecting member 200 also includes a spring 206 between the head of screw 202 and additional heat sink member 106. Screw 202 may thus be inserted down hole 204 into the corresponding threaded hole in main heat sink member 102, and tightened onto spring 206. The strength of the spring, commonly referred to as the "spring-rate", determines how much force is applied to additional heat sink member 100 downward in the Z-direction. Thus, the amount of spring force applied by connecting member 200 is adjustable by selecting the appropriate spring-rate to apply the appropriate force.

There may be multiple connecting members 200 that movably couple additional heat sink member 106 to main heat sink member 102, although only one is shown. Connecting members 200 may also be connected at different locations, as FIG. 2 shows just one example. Connecting members 200 would typically be placed in such a way as to ensure a even, balanced force load upon the component being cooled, especially those that are lid-less (where uneven forces distribution can lead to component damage).

Additional heat sink member 106 may be movably coupled to other structures, and still be movable within void 104. For instance, additional heat sink member 106 may be connected to a support structure (not shown in FIG. 1), an enclosure (not shown in FIG. 1) surrounding heat sink assembly 100, or some other structure.

Additional heat sink member 106 is also thermally connected to main heat sink member 102. Additional heat sink member 106 may be thermally connected to main heat sink member 102 by any heat transfer mechanism adapted to transport thermal energy from additional heat sink member 106 to main heat sink member 102. One example of a heat transfer mechanism is a heat pipe.

Figure 3:
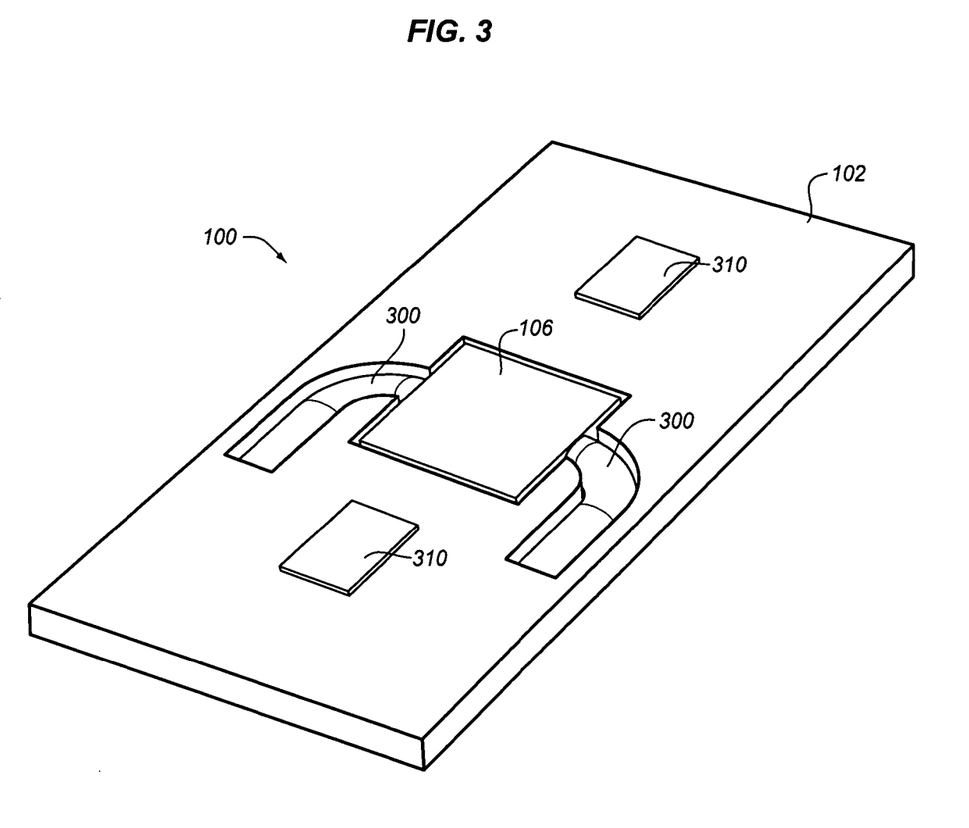
FIG. 3 is an isometric view of the heat sink assembly with one or more heat pipes connecting an additional heat sink member to a main heat sink member in an exemplary embodiment of the invention.

FIG. 3 is an isometric view of heat sink assembly 100 with one or more heat pipes 300 connecting additional heat sink member 106 to main heat sink member 102 in an exemplary embodiment of the invention. FIG. 3 illustrates a bottom view of heat sink assembly 100 (i.e., the side toward a circuit board is visible). Although heat pipes 300 are shown on the bottom surface in this embodiment, heat pipes 300 may be formed on the top surface in other embodiments.

A typical heat pipe 300 consists of a sealed hollow tube formed from a thermo-conductive metal, such as copper or aluminum. The heat pipe 300 is filled with a relatively small quantity of a coolant, such as water, with the remainder of the pipe being filled with vapor phase of the coolant. The internal surface of the heat pipe 300 has a wicking structure that exerts a capillary force on the liquid phase of the coolant. If the heat tube 300 is attached to something hot (i.e., additional heat sink member 106), coolant at the hot end of the heat tube 300 is vaporized and travels toward the cooler end (i.e., where heat pipe 300 connects to main heat sink member 102). The vaporized coolant then condenses, and the condensed coolant travels back toward the hot end due to the capillary action. This process continues to transfer the thermal energy from additional heat sink member 106 to main heat sink member 102.

FIG. 3 also shows a plurality of pads 310 on the bottom surface of main heat sink 102. Pads 310 each represent a Thermal Interface Material (TIM) that is adapted to interface with a component on a circuit board. A TIM comprises any material used to fill the gaps between thermal transfer surfaces, such as between components and heat sinks, in order to increase thermal transfer efficiency.

The bottom surface of additional heat sink member 106 is adapted to thermally contact a component on the circuit board. The bottom surface should be substantially flat and smooth in order to make good thermal contact with the component. A thermally conductive grease may be applied to the bottom surface of additional heat sink member 106 to ensure optimal thermal contact.

Figure 4:
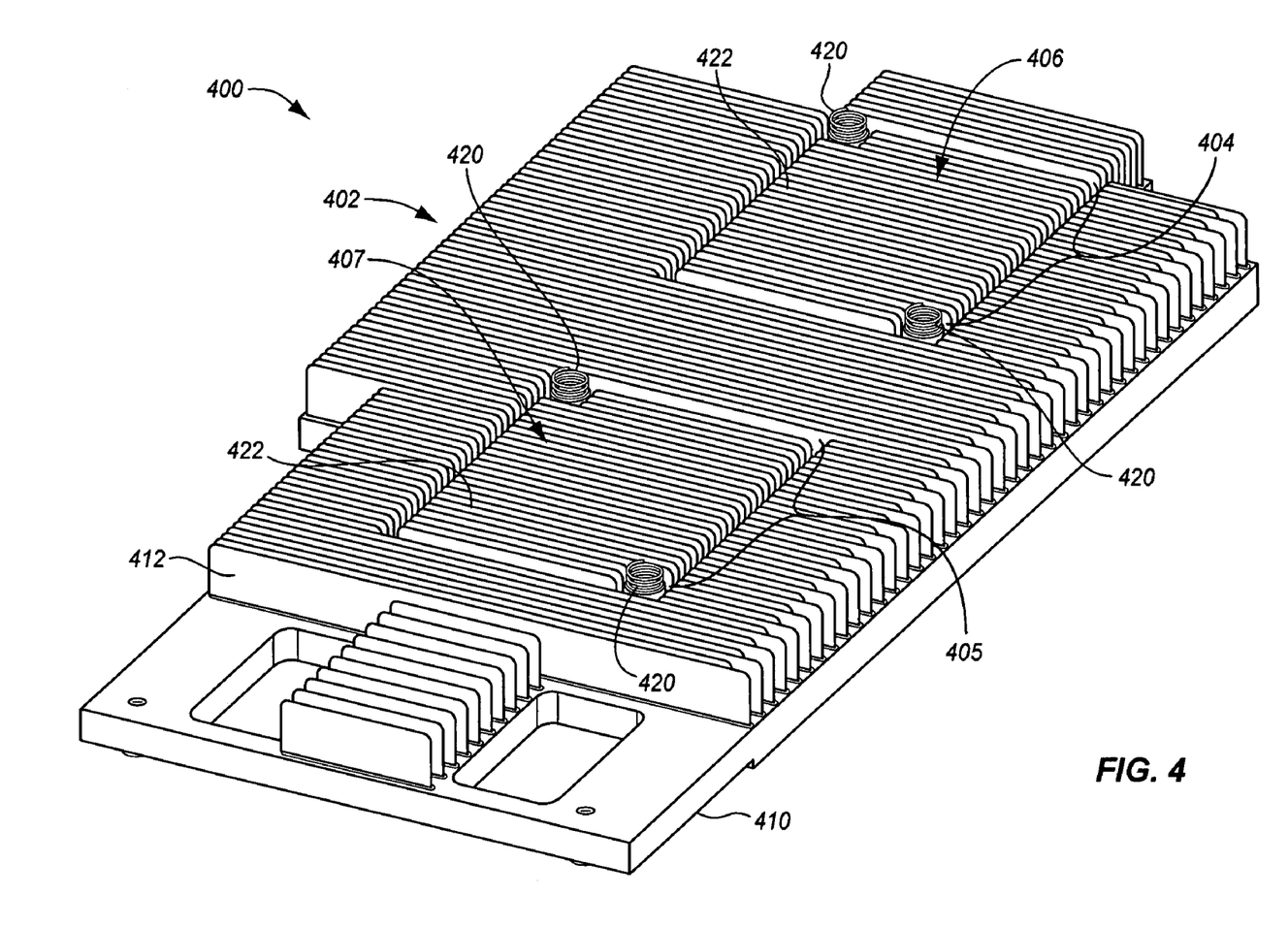
FIG. 4 is an isometric view of the top of another heat sink assembly in an exemplary embodiment of the invention.
Figure 5:
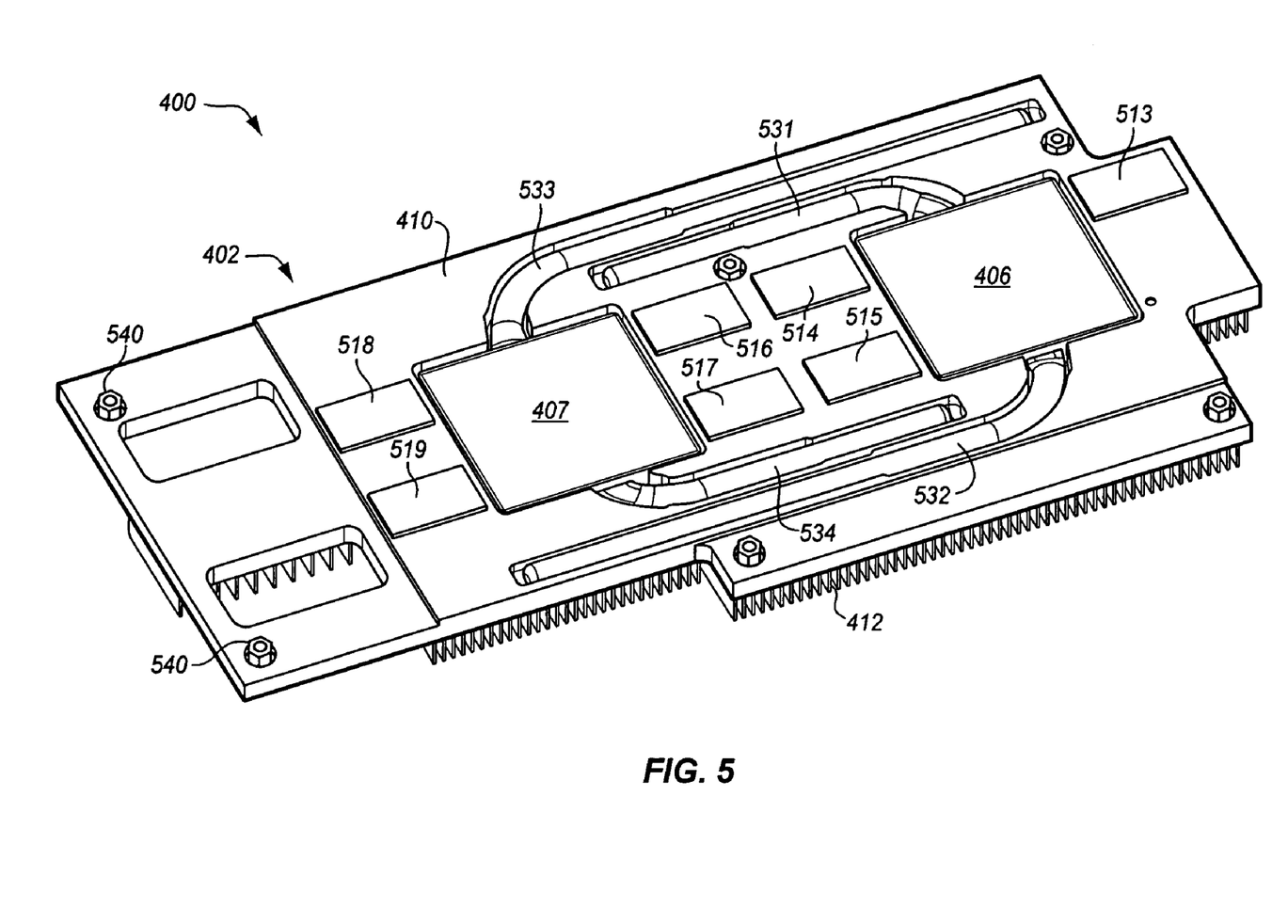
FIG. 5 is an isometric view of the bottom of the heat sink assembly in an exemplary embodiment of the invention.

FIGS. 4-5 illustrate a more detailed heat sink assembly 400 in an exemplary embodiment of the invention. FIG. 4 is an isometric view of the top of a heat sink assembly 400 in an exemplary embodiment of the invention. Heat sink assembly 400 in FIG. 4 includes a larger main heat sink member 402 with a plurality of voids 404-405 formed through main heat sink member 402. Smaller additional heat sink members 406-407 are placed within each of the voids 404-405 and are movably coupled to main heat sink member 402 with a plurality of connecting members 420. Although two additional heat sink members 406-407 are shown, those skilled in the art will appreciate that more or less than two additional heat sink members may be used in other embodiments.

Main heat sink member 402 is comprised of a base 410 with a plurality of fins 412 formed on a first (top) side. A second (bottom) side of main heat sink member 402 is illustrated in FIG. 5. Additional heat sink members 406-407 are comprised of a base (not visible in FIG. 4) with a plurality of fins 422 formed on a first (top) side. A second (bottom) side of additional heat sink members 406-407 is illustrated in FIG. 5.

FIG. 5 is an isometric view of the bottom of heat sink assembly 400 in an exemplary embodiment of the invention. Each of additional heat sink members 406-407 are thermally connected to main heat sink member 402 by heat pipes. For example, additional heat sink member 406 is thermally connected to main heat sink member 402 through heat pipes 531-532. One end of heat pipe 531 is connected to additional heat sink member 406, and the other end of heat pipe 531 is connected to main heat sink member 402. Heat pipe 532 is connected in a similar manner. Additional heat sink member 407 is also thermally connected to main heat sink member 402 through heat pipes 533-534. One end of heat pipe 533 is connected to additional heat sink member 407, and the other end of heat pipe 533 is connected to main heat sink member 402. Heat pipe 534 is connected in a similar manner. Although two heat pipes are connected to each additional heat sink member 406-407, more or less than two heat pipes may be connected to each additional heat sink member 406-407 in other embodiments. Also, although heat pipes are illustrated in this embodiment, other heat transfer mechanisms may be used in other embodiments.

The bottom side of main heat sink member 402 includes a plurality of pads 513-519 formed from a Thermal Interface Material (TIM) that are adapted to interface with components on a circuit board. The pattern of the pads 513-519 will depend on the pattern of the components on a circuit board. The bottom sides of additional heat sink members 406-407 are substantially flat and smooth to interface with components on the circuit board. A thermally conductive grease may be applied to the bottom surface of additional heat sink members 406-407 to ensure optimal thermal contact.

Figure 6:
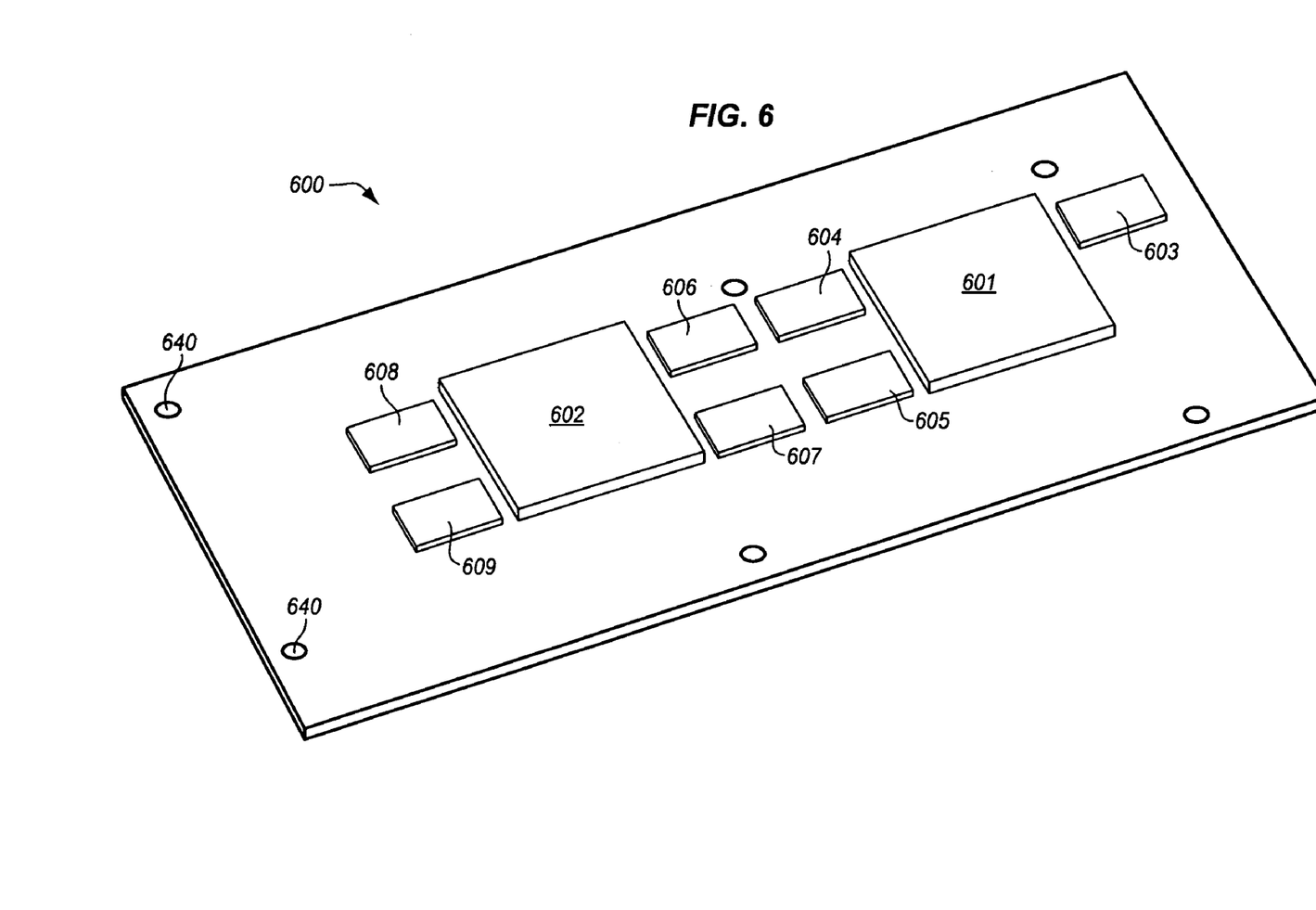
FIG. 6 is an isometric view of a circuit board in an exemplary embodiment of the invention.

FIG. 6 is an isometric view of a circuit board 600 in an exemplary embodiment of the invention. FIG. 6 illustrates a circuit board 600 onto which heat sink assembly 400 in FIGS. 4-5 may be mounted for heat dissipation. Circuit board 600 includes a plurality of mounted components 601-609. Components 601-602 generate more thermal energy during operation as compared to components 603-609. For instance, components 601-602 may comprise microprocessors or an ASIC, while components 603-609 comprise memory chips or some other component that operates at a low temperature. Components 601-602 also have a different height than components 603-609. For example, components 601-602 may have a taller profile than components 603-609.

Assume for example that heat sink assembly 400 as illustrated in FIGS. 4-5 is mounted on circuit board 600. Main heat sink member 402 includes nuts 540 (see FIG. 5) that match the pattern of holes 640 in circuit board 600. A screw or bolt may be passed through holes 640 in order to mate with nuts 540 in main heat sink member 402 to secure main heat sink member 402 to circuit board 600.

When main heat sink member 402 is mounted on circuit board 600, pads 513-519 interface with components 603-609 of circuit board 600, respectively. Pads 513-519 have a desired thickness in order to thermally contact components 603-609. For example, pads 513-519 may have a thickness of about 1-2 millimeters.

At the same time, additional heat sink members 406-407 interface with components 601-602 of circuit board 600, respectively. The bottom surface of additional heat sink member 406 interfaces with component 601 through a thermally conductive grease. Likewise, the bottom surface of additional heat sink member 407 interfaces with component 602 through a thermally conductive grease.

When the circuit board 600 is put into operation, main heat sink member 402 absorbs the thermal energy from components 603-609, and dissipates the absorbed thermal energy to the surrounding environment through fins 412. Additional heat sink members 406-407 absorb the thermal energy from components 601-602, respectfully. Some of the absorbed thermal energy is dissipated to the surrounding environment through fins 422. Some of thermal energy is transferred to main heat sink member 402 through heat pipes 531-534.

Thus, additional heat sink members 406-407 spread the thermal energy to the larger main heat sink member 402 for dissipation. In this embodiment, additional heat sink members 406-407 interface with the hotter components 601-602 on circuit board 600. Because there is thermal spreading to main heat sink member 402, additional heat sink members 406-407 are able to effectively cool components 601-602 even though additional heat sink members 406-407 are relatively small in size. By adjusting the heat pipes 531-534 between the heat sink members or ratio of fin counts, the amount of thermal energy transfer from the higher dissipating components to the lesser dissipating components can be regulated in order to prevent damage to those components having a lower operational temperature.

Because additional heat sink members 406-407 are movably coupled to main heat sink member 402, additional heat sink members 406-407 are able to "float" with voids 404-405 to accommodate the different heights of components 601-602. Consequently, there is a reduced risk of damaging components 601-602 of varying height with heat sink assembly 400. Even if components 601-602 are lid-less, the floating structure of additional heat sink members 406-407 reduces the risk of damage.

The amount of downward force applied to additional heat sink members 406-407 is adjustable through connecting members 420 (see FIG. 4). Based on the maximum load rating for the components 601-602, the connecting members 420 and spring sizes may be adjusted to apply the desired downward force on additional heat sink members 406-407. Thus, good thermal contact may be achieved without damaging additional heat sink members 406-407.

Another advantage of additional heat sink members 406-407 having an adjustable downward force is that a TIM of a fixed thickness does not need to be used as an interface between the additional heat sink members 406-407 and components 601-602. A thermally conductive grease, which may be applied much thinner (e.g., $3-5 \times 10^{-3}$ millimeters) than a typical TIM, may be used as the interface between the additional heat sink members 406-407 and components 601-602. This allows for optimal thermal contact and heat transfer.

Figure 7:
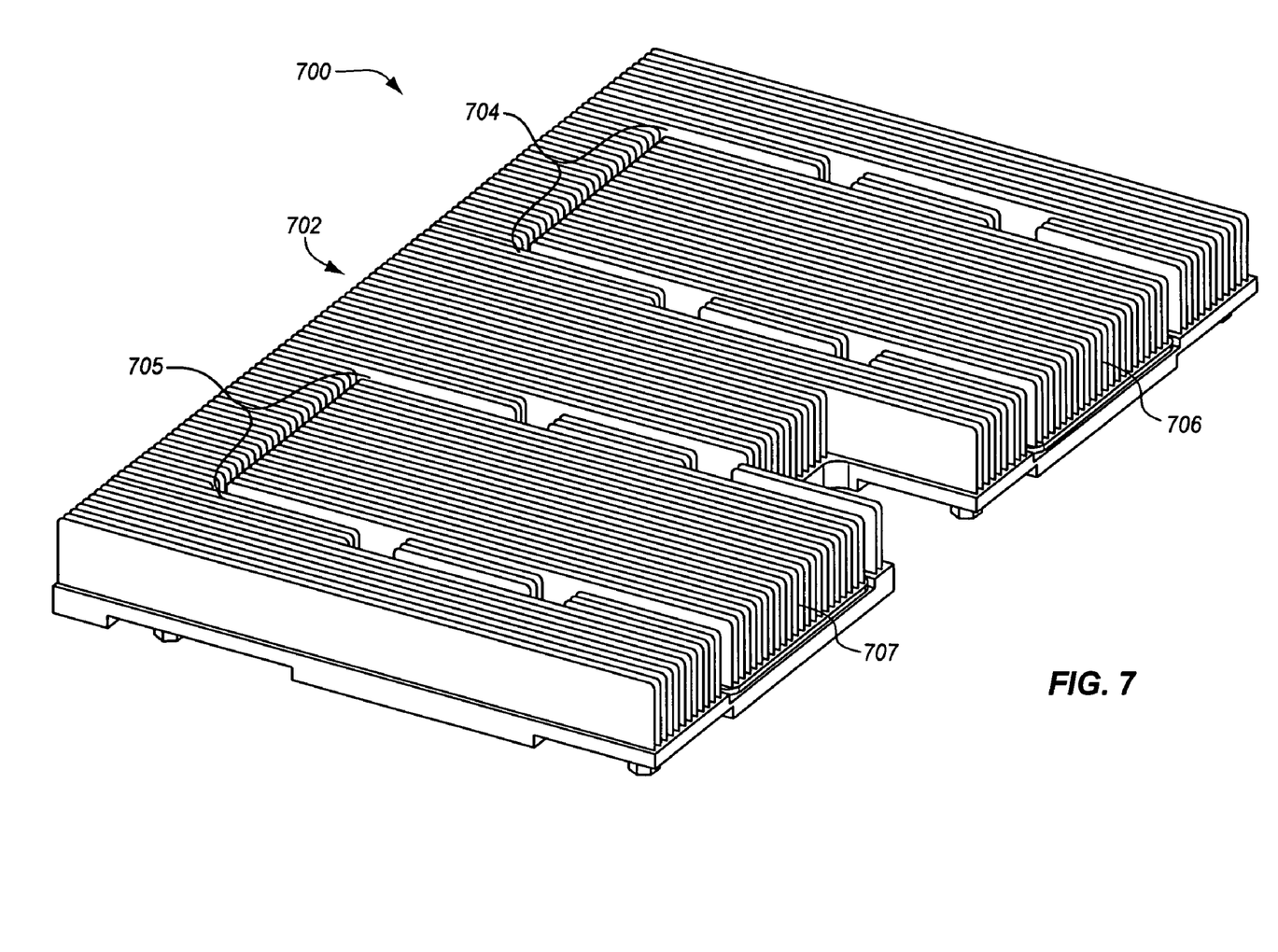
FIG. 7 is an isometric view of the top of another heat sink assembly in an exemplary embodiment of the invention.
Figure 8:
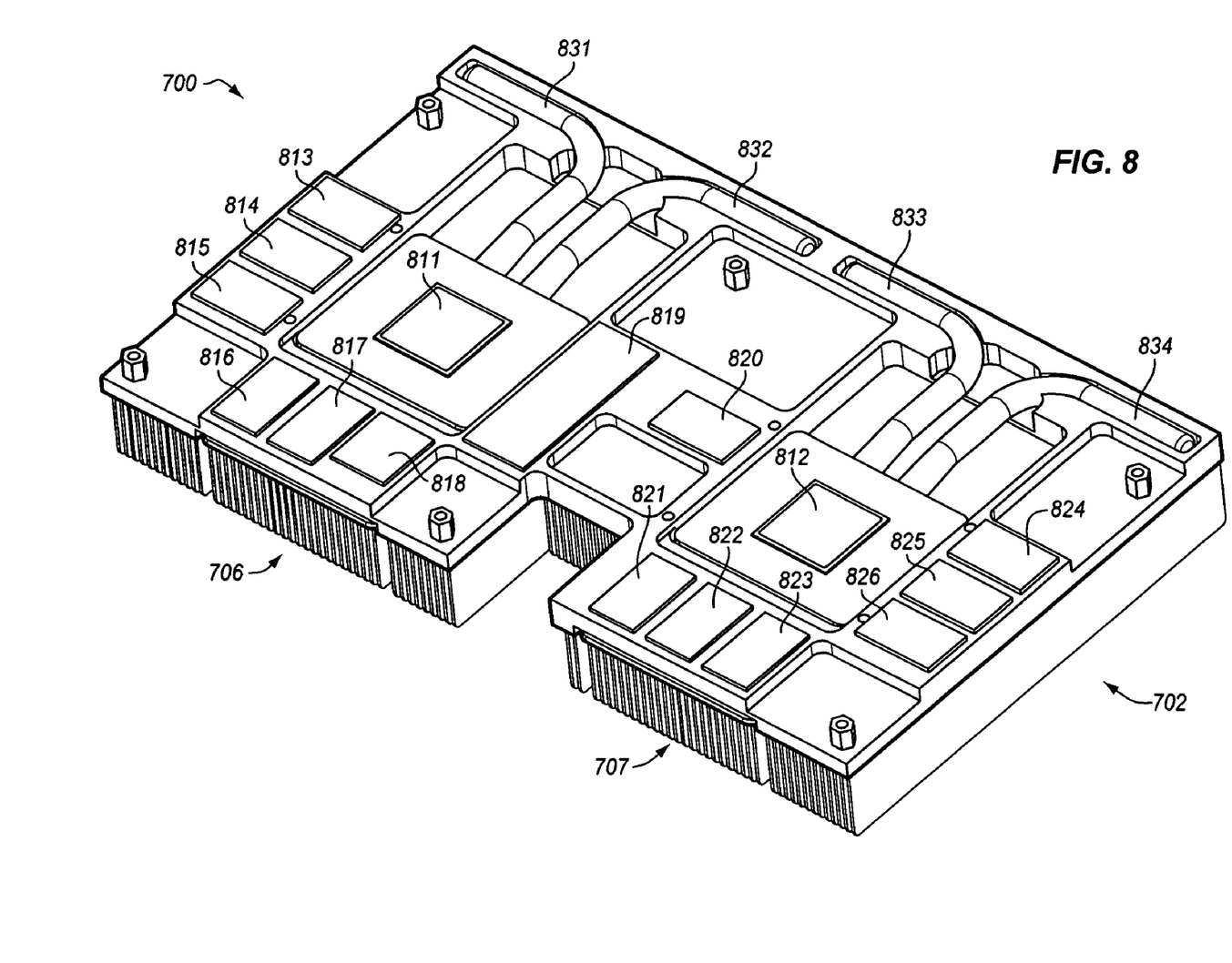
FIG. 8 is an isometric view of the bottom of the heat sink assembly in an exemplary embodiment of the invention.

FIGS. 7-8 illustrate another detailed heat sink assembly 700 in an exemplary embodiment of the invention. FIG. 7 is an isometric view of the top of heat sink assembly 700 in an exemplary embodiment of the invention. As in FIG. 4, heat sink assembly 700 in FIG. 7 includes a larger main heat sink member 702 with a plurality of voids 704-705 formed through main heat sink member 702. Smaller additional heat sink members 706-707 are placed within each of the voids 704-705 and are movably coupled to main heat sink member 702. Although two additional heat sink members 706-707 are shown, those skilled in the art will appreciate that more or less than two additional heat sink members may be used in other embodiments.

FIG. 8 is an isometric view of the bottom of the heat sink assembly 700 in an exemplary embodiment of the invention. Each of additional heat sink members 706-707 are thermally connected to main heat sink member 702 by heat pipes. For example, additional heat sink member 706 is thermally connected to main heat sink member 702 through heat pipes 831-832. One end of heat pipe 831 is connected to additional heat sink member 706, and the other end of heat pipe 831 is connected to main heat sink member 702. Heat pipe 832 is connected in a similar manner. Additional heat sink member 707 is also thermally connected to main heat sink member 702 through heat pipes 833-834. One end of heat pipe 833 is connected to additional heat sink member 707, and the other end of heat pipe 833 is connected to main heat sink member 702. Heat pipe 834 is connected in a similar manner.

The bottom side of main heat sink member 702 includes a plurality of pads 813-826 formed from a Thermal Interface Material (TIM) that are adapted to interface with components on a circuit board. The pattern of the pads 813-826 will depend on the pattern of the components on a circuit board. The bottom sides of additional heat sink members 706-707 each include a pad 811-812 to interface with components on the circuit board.

The embodiments shown in the FIGS. 4-5 and 7-8 illustrate heat sink assemblies that are able to work with a variety of circuit boards. More particularly, the heat sink assemblies may be used with circuit boards that have components of varying heights, varying thermal operating temperatures, varying sizes, etc. Thus, the heat sink assemblies can effectively be used to replace individual heat sinks on the circuit boards.

Although specific embodiments were described herein, the scope of the invention is not limited to those specific embodiments. The scope of the invention is defined by the following claims and any equivalents thereof.

We claim:

1. A heat sink assembly, comprising:
   a main heat sink member adapted to thermally couple with at least one component on a circuit board, the main heat sink member comprising at least one void; and
   at least one additional heat sink member adapted to fit within the at least one void, adapted to move within the void, and adapted to thermally couple with another component on the circuit board;
   wherein the at least one additional heat sink member is thermally connected to the main heat sink member.

2. The heat sink assembly of claim 1 further comprising:
   at least one heat pipe connected between the main heat sink member and the at least one additional heat sink member, wherein the heat pipe is aligned to facilitate heat transfer between the main heat sink member and the additional heat sink member.

3. The heat sink assembly of claim 1 wherein the at least one additional heat sink member is coupled to the main heat sink member through at least one connecting member that applies a spring force on the at least one additional heat sink member.

4. The heat sink assembly of claim 3 wherein the amount of spring force applied by the at least one connecting member is adjustable.

5. The heat sink assembly of claim 1 wherein the main heat sink member includes a base with:
   a plurality of fins on a first side; and
   at least one pad formed from a Thermal Interface Material (TIM) on a second side that is adapted to interface with the at least one component on a circuit board.

6. The heat sink assembly of claim 5 wherein the at least one additional heat sink member includes a base with:
   a plurality of fins on a first side; and
   a surface on a second side that thermally contacts the another component on the circuit board.

7. The heat sink assembly of claim 6 wherein the surface of the at least one additional heat sink member interfaces with the at least one other component on the circuit board through a thermally conductive grease.

8. A heat sink assembly adapted to connect to a circuit board having a plurality of components mounted on the circuit board, the heat sink assembly comprising:
a main heat sink member adapted to thermally couple with at least one component on the circuit board, the main heat sink member comprising at least one void;
at least one additional heat sink member assembled within the at least one void, movably coupled to the main heat sink member through at least one connecting member that applies a force on the at least one additional heat sink member toward the circuit board, and adapted to thermally couple with another component on the circuit board; and
at least one heat pipe connected between the main heat sink member and the at least one additional heat sink member.

9. The heat sink assembly of claim 8 wherein the amount of force applied by the at least one connecting member is adjustable.

10. The heat sink assembly of claim 9 wherein the at least one connecting member comprises:
a screw adapted to pass through a hole in the at least one additional heat sink member and connect with the main heat sink member; and
a spring connected between the head of the screw and the at least one additional heat sink member.

11. The heat sink assembly of claim 8 wherein the main heat sink member includes a base with:
a plurality of fins on a first side; and
at least one pad formed from a Thermal Interface Material (TIM) on a second side that is adapted to interface with the at least one component on the circuit board.

12. The heat sink assembly of claim 11 wherein the at least one additional heat sink member includes a base with:
a plurality of fins on a first side; and
a surface on a second side that thermally contacts the another component on the circuit board.

13. The heat sink assembly of claim 12 wherein the surface of the at least one additional heat sink member thermally contacts the other component on the circuit board through a thermally conductive grease.

14. The heat sink assembly of claim 12 wherein:
the main heat sink assembly thermally contacts an at least one component on the circuit board having a lower thermal energy through the TIM; and
the at least one additional heat sink assembly thermally contacts the other component on the circuit board having a higher thermal energy through the thermally conductive grease.

15. The heat sink assembly of claim 12 wherein:
the main heat sink assembly thermally contacts an at least one component on the circuit board having a first height through the TIM; and
the at least one additional heat sink assembly thermally contacts the other component on the circuit board having a second height through the thermally conductive grease.

16. A heat sink assembly adapted to connect to a circuit board having a plurality of components mounted on the circuit board, the heat sink assembly comprising:
a main heat sink member having a plurality of fins on a first side, and at least one pad formed from a Thermal Interface Material (TIM) on a second side that is adapted to interface with at least one of the components on the circuit board, wherein the main heat sink assembly includes at least one void within the outer boundary of the main heat sink member;
at least one additional heat sink member having a plurality of fins on a first side, and a surface on a second side that is adapted to interface with another component on the circuit board, the at least one additional heat sink member is movably coupled to the main heat sink member so that the at least one additional heat sink member floats within the at least one void; and
at least one heat pipe connected between the main heat sink member and the at least one additional heat sink member.

17. The heat sink assembly of claim 16 wherein the at least one additional heat sink member is movably coupled to the main heat sink member through at least one connecting member that applies a force on the at least one additional heat sink member toward the circuit board.

18. The heat sink assembly of claim 17 wherein the amount of force applied by the at least one connecting member is adjustable.

19. The heat sink assembly of claim 18 wherein the at least one connecting member comprises:
a screw adapted to pass through a hole in the at least one additional heat sink member and connect with the main heat sink member; and
a spring connected between the head of the screw and the at least one additional heat sink member.

20. The heat sink assembly of claim 16 wherein the surface of the at least one additional heat sink member thermally contacts the other component on the circuit board through a thermally conductive grease.

* * * * *